(12) United States Patent
Ahn et al.

(10) Patent No.: US 8,399,320 B2
(45) Date of Patent: *Mar. 19, 2013

(54) ELECTRONIC APPARATUS CONTAINING LANTHANIDE YTTRIUM ALUMINUM OXIDE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/345,984

(22) Filed: Jan. 9, 2012

(65) Prior Publication Data

US 2012/0108052 A1 May 3, 2012

Related U.S. Application Data

(63) Continuation of application No. 12/615,083, filed on Nov. 9, 2009, now Pat. No. 8,093,666, which is a continuation of application No. 11/297,567, filed on Dec. 8, 2005, now Pat. No. 7,615,438.

(51) Int. Cl.
*H01L 21/316* (2006.01)
*H01L 21/336* (2006.01)
*H01L 21/8234* (2006.01)

(52) U.S. Cl. ........ 438/216; 438/240; 438/261; 438/287; 257/E21.159; 257/E21.625; 257/E21.639

(58) Field of Classification Search ............... 438/216, 438/240, 261, 287; 257/E21.159, E21.625, 257/E21.639
See application file for complete search history.

(56) References Cited

U.S. PATENT DOCUMENTS

| | | | |
|---|---|---|---|
| 6,010,969 A | 1/2000 | Vaartstra | |
| 6,063,705 A | 5/2000 | Vaartstra | |
| 6,217,645 B1 | 4/2001 | Vaartstra | |
| 6,225,237 B1 | 5/2001 | Vaartstra | |
| 6,273,951 B1 | 8/2001 | Vaartstra | |
| 6,368,518 B1 | 4/2002 | Vaartstra | |
| 6,455,717 B1 | 9/2002 | Vaartstra | |
| 6,476,434 B1 * | 11/2002 | Noble et al. | 257/302 |
| 6,660,578 B1 * | 12/2003 | Karlsson et al. | 438/199 |
| 6,682,602 B2 | 1/2004 | Vaartstra | |
| 6,730,164 B2 | 5/2004 | Vaartstra et al. | |
| 6,784,049 B2 | 8/2004 | Vaartstra | |
| 6,794,284 B2 | 9/2004 | Vaartstra | |
| 6,958,300 B2 | 10/2005 | Vaartstra et al. | |
| 6,967,159 B2 | 11/2005 | Vaartstra | |
| 6,984,592 B2 | 1/2006 | Vaartstra | |
| 6,995,081 B2 | 2/2006 | Vaartstra | |
| 7,030,042 B2 | 4/2006 | Vaartstra et al. | |
| 7,041,609 B2 | 5/2006 | Vaartstra | |
| 7,057,244 B2 * | 6/2006 | Andreoni et al. | 257/410 |
| 7,077,902 B2 | 7/2006 | Vaartstra | |
| 7,087,481 B2 | 8/2006 | Vaartstra et al. | |

(Continued)

OTHER PUBLICATIONS

Putkonen et al., "Low-Temperature Ale Deposition of Y2O3 Thin Films From B-DiKetonate Precursors", Chemical Vapor Deposition, vol. 7, No. 1, 2001, pp. 44-50.*

(Continued)

*Primary Examiner* — Mary Wilczewski
(74) *Attorney, Agent, or Firm* — Schwegman, Lundberg & Woessner, P.A.

(57) ABSTRACT

Electronic apparatus and methods of forming the electronic apparatus include a lanthanide yttrium aluminum oxide dielectric film on a substrate for use in a variety of electronic systems. The lanthanide yttrium aluminum oxide film may be structured as one or more monolayers. The lanthanide yttrium aluminum oxide film may be formed by a monolayer or partial monolayer sequencing process such as using atomic layer deposition.

20 Claims, 3 Drawing Sheets

U.S. PATENT DOCUMENTS

| | | | |
|---|---|---|---|
| 7,112,485 B2 | 9/2006 | Vaartstra | |
| 7,115,166 B2 | 10/2006 | Vaartstra et al. | |
| 7,115,528 B2 | 10/2006 | Vaartstra et al. | |
| 7,115,566 B2 | 10/2006 | Vaartstra et al. | |
| 7,122,464 B2 | 10/2006 | Vaartstra | |
| 7,125,815 B2 | 10/2006 | Vaartstra | |
| 7,196,007 B2 | 3/2007 | Vaartstra | |
| 7,250,367 B2 | 7/2007 | Vaartstra et al. | |
| 7,253,122 B2 | 8/2007 | Vaartstra | |
| 7,271,077 B2 | 9/2007 | Vaartstra et al. | |
| 7,294,556 B2 | 11/2007 | Vaartstra | |
| 7,300,870 B2 | 11/2007 | Vaartstra | |
| 7,332,442 B2 | 2/2008 | Vaartstra et al. | |
| 7,368,402 B2 | 5/2008 | Vaartstra | |
| 7,374,617 B2 | 5/2008 | Vaartstra | |
| 7,410,918 B2 | 8/2008 | Vaartstra | |
| 7,615,438 B2 * | 11/2009 | Ahn et al. | 438/216 |
| 8,093,666 B2 * | 1/2012 | Ahn et al. | 257/410 |
| 2001/0042505 A1 | 11/2001 | Vaartstra | |
| 2003/0043630 A1 | 3/2003 | Forbes et al. | |
| 2003/0043633 A1 | 3/2003 | Forbes et al. | |
| 2003/0176065 A1 | 9/2003 | Vaartstra | |
| 2003/0200917 A1 | 10/2003 | Vaartstra | |
| 2003/0207540 A1 * | 11/2003 | Ahn et al. | 438/287 |
| 2003/0213987 A1 * | 11/2003 | Basceri et al. | 257/296 |
| 2004/0040494 A1 | 3/2004 | Vaartstra et al. | |
| 2004/0040501 A1 | 3/2004 | Vaartstra | |
| 2004/0043151 A1 | 3/2004 | Vaartstra | |
| 2004/0043600 A1 | 3/2004 | Vaartstra | |
| 2004/0043604 A1 | 3/2004 | Vaartstra | |
| 2004/0043625 A1 | 3/2004 | Vaartstra et al. | |
| 2004/0043630 A1 | 3/2004 | Vaartstra et al. | |
| 2004/0043632 A1 | 3/2004 | Vaartstra | |
| 2004/0043633 A1 | 3/2004 | Vaartstra | |
| 2004/0043634 A1 | 3/2004 | Vaartstra | |
| 2004/0043635 A1 | 3/2004 | Vaartstra | |
| 2004/0043636 A1 | 3/2004 | Vaartstra et al. | |
| 2004/0077177 A1 * | 4/2004 | Andreoni et al. | 438/704 |
| 2004/0126954 A1 | 7/2004 | Vaartstra et al. | |
| 2004/0152254 A1 | 8/2004 | Vaartstra et al. | |
| 2004/0187968 A1 | 9/2004 | Vaartstra | |
| 2004/0197946 A1 | 10/2004 | Vaartstra et al. | |
| 2004/0219746 A1 | 11/2004 | Vaartstra et al. | |
| 2005/0009266 A1 | 1/2005 | Vaartstra | |
| 2005/0009368 A1 | 1/2005 | Vaartstra | |
| 2005/0019978 A1 | 1/2005 | Vaartstra et al. | |
| 2005/0028733 A1 | 2/2005 | Vaartstra | |
| 2005/0032360 A1 | 2/2005 | Vaartstra | |
| 2005/0124109 A1 | 6/2005 | Quevedo-Lopez et al. | |
| 2005/0124171 A1 | 6/2005 | Vaartstra | |
| 2005/0136689 A9 | 6/2005 | Vaartstra | |
| 2005/0160981 A9 | 7/2005 | Vaartstra | |
| 2005/0173755 A1 | 8/2005 | Forbes | |
| 2005/0221006 A1 | 10/2005 | Vaartstra | |
| 2005/0287804 A1 | 12/2005 | Vaartstra | |
| 2005/0287819 A1 | 12/2005 | Vaartstra et al. | |
| 2006/0046521 A1 | 3/2006 | Vaartstra et al. | |
| 2006/0048711 A1 | 3/2006 | Vaartstra | |
| 2006/0172485 A1 | 8/2006 | Vaartstra | |
| 2006/0231017 A1 | 10/2006 | Vaartstra | |
| 2006/0252244 A1 | 11/2006 | Vaartstra et al. | |
| 2006/0252279 A1 | 11/2006 | Vaartstra | |
| 2006/0258175 A1 | 11/2006 | Vaartstra et al. | |
| 2006/0261389 A1 | 11/2006 | Vaartstra | |
| 2006/0292788 A1 | 12/2006 | Vaartstra | |
| 2007/0006798 A1 | 1/2007 | Vaartstra et al. | |
| 2007/0144438 A1 | 6/2007 | Vaartstra | |
| 2007/0155190 A1 | 7/2007 | Vaartstra et al. | |
| 2007/0161260 A1 | 7/2007 | Vaartstra | |
| 2007/0166999 A1 | 7/2007 | Vaartstra | |
| 2007/0295273 A1 | 12/2007 | Vaartstra | |
| 2008/0064210 A1 | 3/2008 | Vaartstra | |
| 2008/0102629 A1 | 5/2008 | Vaartstra | |

OTHER PUBLICATIONS

Triyoso et al., "Evaluation of lanthanum based gate dielectrics deposited by atomic layer deposition", J. Vac. Sci. Technol. B, vol. 23, No. 1, Jan./Feb. 2005, pp. 288-297.*

"U.S. Appl. No. 12/615,083 Advisory Action mailed Mar. 28, 2011", 4 pgs.

"U.S. Appl. No. 12/615,083, Final Office Action mailed Dec. 29, 2010 ", 11 pgs.

"U.S. Appl. No. 12/615,083, Non-Final Office Action mailed Jul. 9, 2010 ", 15 pgs.

"U.S. Appl. No. 12/615,083, Notice of Allowance mailed Sep. 2, 2011", 8 pgs.

"U.S. Appl. No. 12/615,083, Response filed Feb. 28, 2011 to Final Office Action mailed Dec. 29, 2010 ", 11 pgs.

"U.S. Appl. No. 12/615,083, Response filed Oct. 11, 2010 to Non Final Office Action mailed Jul. 9, 2010 ", 11 pgs.

Copel, M., et al., "Robustness of ultrathin aluminum oxide dielectrics on Si(001)", Applied Physics Letters, vol. 78, No. 18, (Apr. 30, 2001), 2670-2672.

Ferguson, J D, et al., "Atomic layer deposition of Al2O3 and SiO2 on BN particles using sequential surface reactions", Applied Surface Science, 162-163, (Aug. 1, 2000), 280-292.

Fischetti, M. V., et al., "Performance degradation of small silicon devices caused by long-range Coulomb interactions", Applied Physics Letters, vol. 76, No. 16, (Apr. 17, 2000), 2277-2279.

Giannozzi, Paolo, et al., "Ab initio calculation of phonon dispersions in semiconductors", Physical Review B, vol. 43, No. 9, (Mar. 15, 1991), 7231-7242.

Gordon, Roy G., et al., "Vapor Deposition of Metal Oxides and Silicates: Possible Gate Insulators for Future Microelectronics", Chemistry of Materials, 13, (Jul. 10, 2001), 2463-2464.

Jeong, Chang-Wook, et al., "Plasma-Assisted Atomic layer Growth of High-Quality Aluminum Oxide Thin Films", Japanese Journal of Applied Physics, 40, (Jan. 2001), 285-289.

Kim, C. T, et al., "Application of Al2O3 Grown by Atomic Layer Deposition to DRAM and FeRAM", International Symposium in Integrated Ferroelectrics, (Mar. 2000), 316.

Kim, Hyoungsub, et al., "Effects of crystallization on the electrical properties of ultrathin HfO2 dielectrics grown by atomic layer deposition", Applied Physics Letters, vol. 82, No. 1, (Jan. 6, 2003), 106-108.

Kim, Y, et al., "Substrate dependence on the optical properties of Al2O3 films grown by atomic layer deposition", Applied Physics Letters, 71(25), (Dec. 22, 1997), 3604-3606.

Kingon, Angus I, et al., "review article Alternative dielectrics to silicon dioxide for memory and logic devices", Nature, 406, (Aug. 31, 2000), 1032-1038.

Kukli, K., et al., "Controlled growth of yttrium oxysulphide thin films by atomic layer deposition", Materials Science Forum, 315-317, (1999), 216-221.

Lu, Xu-Bing, et al., "Structure and dielectric prioperties of amorphous LaAlO3 and LaAlOxNy films as alternative gate dielectric materials", Journal of Applied Physics, 94(2), (Jul. 15, 2003), 1229-1234.

Molsa, Heini, et al., "Growth of yttrium oxide thin films from beta -diketonate precursor," Advanced Materials for Optics and Electronics, 4(6), (Nov.-Dec. 1994), 389-400.

Nieminen, Minna, et al., "Formation and stability of lanthanum oxide thin films deposited from B-diketonate precursor," Applied Surface Science, 174(2), (Apr. 16, 2001), 155-165.

Peercey, Paul S., "The drive to miniaturization", Nature, vol. 406, (Aug. 31, 2000), 1023-1026.

Punchaipetch, Prakaipetch, et al., "Growth and characterization of hafnium silicate films prepared by UV/ozone oxidation", J. Vac. Sci. Technol. A 22(2), (Mar./Apr. 2004), 395-400.

Putkonen, Matti, et al., "Low-Temperature ALE Deposition of Y2O3 Thin Films from Beta-Didetonate Precursors", Chemical Vapor Deposition, vol. 7, No. 1, (2001), 44-50.

Rignanese, G.-M., et al., "Dielectric Constants of Zr Silicates: A First-Principles Study", Physical Review Letters, Vo. 89, No. 11, (Sep. 9, 2002), 117601-1 through 117601-4.

Shevlin, Stephen A., et al., "Ab Initiio Design of High-k Diectrics: LaxY1-xAlO3", Physical Review Letters, PRL 94, (Apr. 13, 2005), 146401-1 through 146401-4.

Shin, Chang Ho, "Fabrication and Characterization of MFISFET Using Al2O3 Insulating Layer for Non-volatile Memory", 12th International Symposium in Integrated Ferroelectrics, (Mar. 2000), 9 pages.

Triyoso, D. H., et al., "Film properties of ALD HfO2 and La2O3 gate dielectrics grown on Si with various pre-deposition treatments", J. Vac. Sci. Technol. B 22(4), (Jul./Aug. 2004), 2121-2127.

Watanabe, Heiji, "Ultrathin zirconium silicate gate dielectrics with compositional gradation formed by self-organized reactions", Applied Physics Letters, vol. 81, No. 22, (Nov. 25, 2002), 4221-4223.

Wilk, G. D., "High-K gate dielectrics: Current status and materials properties considerations", Journal of Applied Physics, 89(10), (May 2001), 5243-5275.

Xiang, Wenfeng, et al., "Characteristics of LaAlO3/Si(100) deposited under various oxygen pressures", Journal of Applied Physics, vol. 20, No. 1, (Jan. 1, 2003), 533-536.

Zhao, Xinyuan, et al., "First-principles study of structural, vibrational, and lattice dielectric properties of hafnium oxide", Physical Review B, vol. 65, (2002), 233106-1 through 233106-4.

Fischetti, Massimo V., et al., "Effective electron mobility in Si inversion layers in metal-oxide-semiconductor systems with a high-k insulator: The role of remote phonon scattering", Journal of Applied Physics, vol. 90, No. 9, (Nov. 1, 2001), 4587-4608.

Kim, Y., et al., "Substrate dependence on the optical properties of Al/sub 2/O/sub 3/ films grown by atomic layer deposition", Applied Physics Letters, 71(25 ), (Dec. 22, 1997), 3604-3606.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

* cited by examiner

ELECTRONIC APPARATUS CONTAINING LANTHANIDE YTTRIUM ALUMINUM OXIDE

RELATED APPLICATION

This application is a continuation of U.S. application Ser. No. 12/615,083, filed Nov. 9, 2009now U.S. Pat. No. 8,093,666, which is a continuation application of U.S. application Ser. No. 11/297,567, filed 8 Dec. 2005, now issued as U.S. Pat. No. 7,615,438, all of which are incorporated herein by reference in their entirety.

TECHNICAL FIELD

This application relates generally to semiconductor devices and device fabrication.

BACKGROUND

The semiconductor device industry has a market driven need to reduce the size of devices used in products such as processor chips, mobile telephones, and memory devices such as dynamic random access memories (DRAMs). Currently, the semiconductor industry relies on the ability to reduce or scale the dimensions of its basic devices. This device scaling includes scaling dielectric layers in devices such as, for example, capacitors and silicon based metal oxide semiconductor field effect transistors (MOSFETs) and variations thereof, which have primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other materials as dielectric regions in a variety of electronic structures.

DETAILED DESCRIPTION

Figure 1:
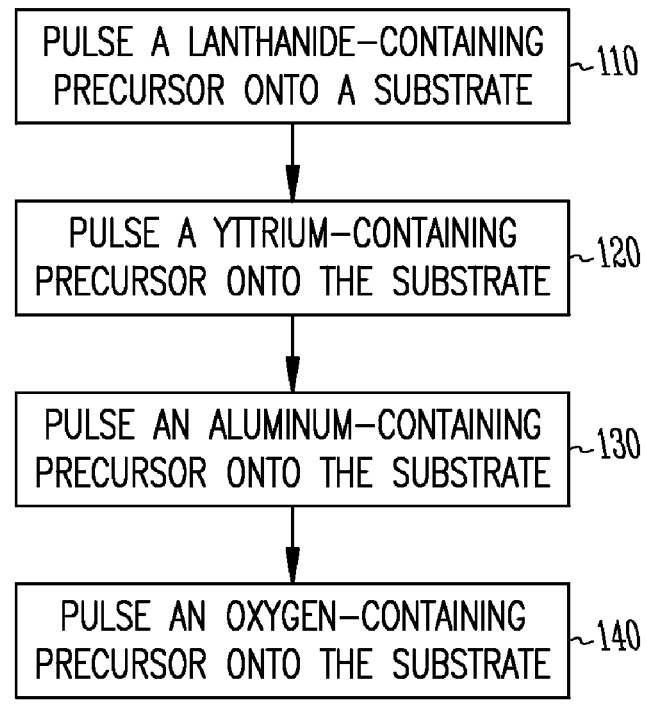
FIG. 1 illustrates features for an embodiment of a method to form a lanthanide yttrium aluminum oxide film by atomic layer deposition.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

To scale a dielectric region to minimize feature sizes to provide high density electronic devices, the dielectric region should have a reduced equivalent oxide thickness ($t_{eq}$). The equivalent oxide thickness quantifies the electrical properties, such as capacitance, of the dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface will have a $t_{eq}$ larger than its thickness, t. This $t_{eq}$ results from the capacitance in the surface on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale a gate dielectric equivalent oxide thickness to less than 10 Å, the physical thickness requirement for a $SiO_2$ layer used for a gate dielectric may need to be approximately 4 to 7 Å. Additional requirements on a $SiO_2$ layer would depend on the electrode used in conjunction with the $SiO_2$ dielectric. Using a conventional polysilicon electrode may result in an additional increase in $t_{eq}$ for the $SiO_2$ layer. This additional thickness may be eliminated by using a metal electrode, though such metal electrodes are not universally used for all devices. Thus, future devices would be designed towards a physical $SiO_2$ dielectric layer of about 5 Å or less. Such a small thickness requirement for a $SiO_2$ oxide layer creates additional problems.

Silicon dioxide is used as a dielectric layer in devices, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap may eliminate it as a material for a dielectric region in an electronic device. As the thickness of a $SiO_2$ layer decreases, the number of atomic layers, or monolayers of the material decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ dielectric may cause an effective short between an underlying Si electrode and an overlying polysilicon electrode. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a dielectric region in such future devices.

In many cases, for a typical dielectric layer, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $K_{ox}=3.9$, as $$t = (\kappa/\kappa_{ox}) t_{eq} = (\kappa/3.9) t_{eq}.$$

Thus, materials with a dielectric constant greater than that of $SiO_2$ will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower device operating voltages and smaller device dimensions may be realized by a significant number of materials, but additional fabricating requirements make determining a suitable replacement for $SiO_2$ difficult. The current view for the microelectronics industry is still for Si based devices. This may require that the dielectric material employed be grown on a silicon substrate or a silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq} = t_{SiO2} + (\kappa_{ox}/\kappa) t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer should provide a high quality interface.

One of the advantages of using $SiO_2$ as a dielectric layer in a device has been that the formation of the $SiO_2$ layer results in an amorphous dielectric. Having an amorphous structure for a dielectric provides for reducing problems of leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Typically, materials having a high dielectric constant relative to $SiO_2$ also have a crystalline form, at least in a bulk configuration. The best candidates for replacing $SiO_2$ as a dielectric in a device are those that can be fabricated as a thin layer with an amorphous form and that have high dielectric constants.

In an embodiment, a lanthanide yttrium aluminum oxide dielectric film may be formed using atomic layer deposition (ALD). Forming such a dielectric film using atomic layer deposition can provide for controlling transitions between material layers. As a result of such control, atomic layer deposited lanthanide yttrium aluminum oxide dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly larger, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Atomic layer deposition provides for controlling film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming aluminum oxide from an $Al(CH_3)_3$ precursor and water vapor, as its reactant precursor, forms an embodiment of an aluminum/oxygen sequence, which can also be referred to as an aluminum sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, water vapor is an oxygen reactant precursor. A cycle of a sequence may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ compound uses one precursor that contains the elements A and B, such that pulsing the AB containing precursor followed by its reactant precursor onto a substrate may include a reaction that deposits $ABO_x$ on the substrate to provide an AB/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a cycle for an ALD formation of the quaternary compound, lanthanide yttrium aluminum oxide, may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas/a third precursor/a purging gas for the third precursor/a third reactant precursor/the third reactant precursor's purging gas, which may be viewed as a cycle having three sequences. In an embodiment, a layer substantially of a lanthanide yttrium aluminum oxide compound is formed on a substrate mounted in a reaction chamber using ALD in repetitive lanthanum, yttrium, and aluminum sequences using precursor gases individually pulsed into the reaction chamber. Alternatively, solid or liquid precursors can be used in an appropriately designed reaction chamber.

In an embodiment, a lanthanide yttrium aluminum oxide layer may be structured as one or more monolayers. A film of lanthanide yttrium aluminum oxide, structured as one or more monolayers, may have a thickness that ranges from a monolayer to thousands of angstroms. The film may be processed by atomic layer deposition. Embodiments of an atomic layer deposited lanthanide yttrium aluminum oxide layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

The term lanthanide yttrium aluminum oxide is used herein with respect to a compound that essentially consists of the lanthanide, yttrium, aluminum, and oxygen in a form that may be stoichiometric, non-stoichiometric, or a combination of stoichiometric and non-stoichiometric. In an embodiment, the lanthanide yttrium aluminum oxide may be formed substantially as stoichiometric lanthanide yttrium aluminum oxide. In an embodiment, the lanthanide yttrium aluminum oxide may be formed substantially as a non-stoichiometric lanthanide yttrium aluminum oxide or a combination of non-stoichiometric lanthanide yttrium aluminum oxide and stoichiometric lanthanide yttrium aluminum oxide. Herein, a lanthanide yttrium aluminum oxide compound may be expressed as LnYAlO or $Ln_xY_yAl_zO_r$. Ln represents an element selected from the group of elements known as lanthanides. The lanthanides include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). The expression LnYAlO or its equivalent forms may be used to include a stoichiometric lanthanide yttrium aluminum oxide. The expression LnYAlO or its equivalent forms may be used to include a non-stoichiometric lanthanide yttrium aluminum oxide. The expression LnYAlO or its equivalent forms may be used to include a combination of a stoichiometric lanthanide yttrium aluminum oxide and a non-stoichiometric lanthanide yttrium aluminum oxide. In an embodiment, a lanthanide yttrium aluminum oxide film includes $La_xY_{1-x}AlO_3$, where $0<x<1$. In an embodiment, a lanthanide yttrium aluminum oxide film includes $La_xY_{1-x}AlO_3$, where $0.2<x<0.4$. The expression $LnO_x$ may be used to include a stoichiometric lanthanide oxide. The expression $LnO_x$ may be used to include a non-stoichiometric lanthanide oxide. The expression $LnO_x$ may be used to include a combination of a stoichiometric lanthanide oxide and a non-stoichiometric lanthanide oxide. Expressions $YO_y$ and $AlO_r$ may be used in the same manner as $LnO_x$. In various embodiments, a lanthanide yttrium aluminum oxide film may be doped with elements or compounds other than the lanthanide, yttrium, aluminum, and oxygen.

In an embodiment, a LnYAlO film may be structured as one or more monolayers. In an embodiment, the LnYAlO film may be constructed by atomic layer deposition. Prior to forming the LnYAlO film by ALD, the surface on which the LnYAlO film is to be deposited may undergo a preparation stage. The surface may be the surface of a substrate for an integrated circuit. In an embodiment, the substrate used for forming a transistor may include a silicon or silicon containing material. In other embodiments, germanium, gallium arsenide, silicon-on-sapphire substrates, or other suitable substrates may be used. A preparation process may include cleaning the substrate and forming layers and regions of the substrate, such as drains and sources, prior to forming a gate dielectric in the formation of a metal oxide semiconductor (MOS) transistor. Alternatively, active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a lanthanide yttrium aluminum oxide dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer may improve the interface density, fixed charge density, and channel mobility of a device having this interface layer.

The sequencing of the formation of the regions of an electronic device, such as a transistor, being processed may follow typical sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, the unmasked region includes a body region of a transistor; however, one skilled in the art will recognize that other semiconductor device structures may utilize this process.

FIG. 1 illustrates features of an embodiment of a method to form a lanthanide yttrium aluminum oxide film by atomic layer deposition. The individual features labeled 110, 120, 130, and 140 may be performed in various orders. Between each pulsing of a precursor used in the atomic layer deposition process, a purging gas may be pulsed into the ALD reaction chamber. Between each pulsing of a precursor, the ALD reactor chamber may be evacuated using vacuum techniques as is known by those skilled in the art. Between each pulsing of a precursor, a purging gas may be pulsed into the ALD reaction chamber and the ALD reactor chamber may be evacuated.

At 110, a lanthanide-containing precursor is pulsed onto a substrate in an ALD reaction chamber. A number of precursors containing a lanthanide may be used to provide the lanthanide to a substrate for an integrated circuit. In an embodiment, a precursor containing a lanthanide may include $Ln(thd)_3$ (thd=2,2,6,6-tetramethyl-3,5-heptanedione). Ozone may be used as its reactant precursor in a lanthanide sequence. In an embodiment, the substrate temperature is maintained at a temperature below about 650° C. In an embodiment, the substrate temperature is maintained at about 300° C. In an embodiment, a lanthanum-containing precursor is pulsed onto a substrate in an ALD reaction chamber. A number of precursors containing lanthanum may be used to provide lanthanum on a substrate for an integrated circuit. In an embodiment using a $La(thd)_3$ precursor, the substrate may be maintained at a temperature ranging from 180° C. to about 425° C. In an embodiment, the lanthanum-containing precursor may be lanthanum tris[bis(trimethylsilyl)amide], $La(N(SiMe_3)_2)_3 = C_{18}H_{54}N_3LaSi_6$, where Me is an abbreviation for the methyl-group, $CH_3$. Water may be used as an oxygen reactant precursor for $La(N(SiMe_3)_2)_3$. The substrate may be maintained at temperatures ranging from about 200° C. to about 300° C. In an embodiment, the lanthanum-containing precursor may be tris(2,2,6,6-tetramethyl-3,5-heptanedionato)lanthanum (III) tetraglyme adduct. In an embodiment, the lanthanum-containing precursor may be trisethylcyclopentadionatolanthanum ($La(EtCp)_3$), where Et is an abbreviation for ethyl, $CH_2CH_3$, and Cp is an abbreviation for a cyclopentadienyl ligand having the formula $C_5H_5$. In an embodiment using a $La(EtCp)_3$ precursor, the substrate temperature may be maintained at a temperature ranging from about 400° C. to about 650° C. In an embodiment, the lanthanum-containing precursor may be trisdipyvaloylmethanatolanthanum ($La(DPM)_3$). In an embodiment, $H_2$ may be pulsed along with the $La(EtCp)_3$ precursor or the $La(DPM)_3$ precursor to reduce carbon contamination in the deposited film. In various embodiments, after pulsing the lanthanum-containing precursor and purging the reaction chamber of excess precursor and by-products from pulsing the precursor, a reactant precursor may be pulsed into the reaction chamber. The reactant precursor may be an oxygen reactant precursor. In various embodiments, use of the individual lanthanum-containing precursors is not limited to the temperature ranges of the above embodiments. In addition, the pulsing of the lanthanum precursor may use a pulsing period that provides uniform coverage of a monolayer on the surface or may use a pulsing period that provides partial coverage of a monolayer on the surface during a lanthanum sequence.

At 120, an yttrium-containing precursor is pulsed to the substrate. A number of precursors containing yttrium may be used to provide the yttrium to the substrate. In an embodiment, a precursor containing yttrium may include $Y(thd)_3$ (thd=2,2,6,6-tetramethyl-3,5-heptanedione). Ozone or water may be used as its reactant precursor in a yttrium sequence. In an embodiment, a precursor containing yttrium may include $Y(thd)_3(2,2'\text{-bipyridyl})$, where 2,2'-bipyridyl is $C_{10}H_8N_2$. Ozone may be used as its reactant precursor in a yttrium sequence. In an embodiment, a precursor containing yttrium may include $Y(thd)_3(1,10\text{-phenanthroline})$, where 1,10-phenanthroline is $C_{12}H_8N_2$. Ozone may be used as its reactant precursor in a yttrium sequence. During a yttrium sequence, the substrate may be held between about 200° C. and about 500° C. In various embodiments, after pulsing the yttrium-containing precursor and purging the reaction chamber of excess precursor and by-products from pulsing the precursor, a reactant precursor may be pulsed into the reaction chamber. The reactant precursor may be an oxygen reactant precursor. In various embodiments, use of the individual yttrium-containing precursors is not limited to the temperature ranges of the above embodiments. In addition, the pulsing of the yttrium precursor may use a pulsing period that provides uniform coverage of a monolayer on the surface or may use a pulsing period that provides partial coverage of a monolayer on the surface during an yttrium sequence.

At 130, an aluminum-containing precursor is pulsed to the substrate. A number of precursors containing aluminum may be used to provide the aluminum on the substrate. In an embodiment, the aluminum-containing precursor may be trimethylaluminum (TMA), $Al(CH_3)_3$. Distilled water vapor may be used as an oxygen reactant precursor for TMA. In an embodiment, the aluminum-containing precursor may be dimethylethylamine alane (DMEAA), $(CH_3)_2CH_3CH_2NAlH_3$ (an adduct of alane ($AlH_3$) and dimethylethylamine $[N(CH_3)_2(C_2H_5)]$). In an embodiment using a DMEAA precursor, a hydrogen plasma may be introduced after pulsing the DMEAA precursor in a plasma-assisted atomic layer deposition process. In various embodiments, a LnYAlO layer may be deposited on a substrate using plasma-assisted atomic layer deposition. During pulsing of the aluminum-containing precursor, the substrate may be held between about 350° C. and about 450° C. In various embodiments, after pulsing the aluminum-containing precursor and purging the reaction chamber of excess precursor and by-products from pulsing the precursor, a reactant precursor may be pulsed into the reaction chamber. The reactant precursor may be an oxygen reactant precursor. In various embodiments, use of the individual aluminum-containing precursors is not limited to the temperature ranges of the above embodiments. In addition, the pulsing of the aluminum precursor may use a pulsing period that provides uniform coverage of a monolayer on the surface or may use a pulsing period that provides partial coverage of a monolayer on the surface during an aluminum sequence.

At 140, an oxygen-containing precursor is pulsed to the substrate. The oxygen-containing precursor may be pulsed after a purge of the reaction chamber following each of the precursors providing lanthanum, yttrium, and aluminum for the formation of a layer of LnYAlO. In an embodiment, an oxygen-containing precursor is pulsed after the precursors containing lanthanum, yttrium, and aluminum have been pulsed to provide a common oxygen reactant precursor. Various oxygen-containing precursors may be used as oxygen reactant precursors for each of a lanthanide sequence, a yttrium sequence, and an aluminum sequence. In various embodiments, oxygen-containing precursors for the ALD formation of a LnYAlO film may include, but are not limited to, one or more of water, atomic oxygen, molecular oxygen, ozone, hydrogen peroxide, a water-hydrogen peroxide mixture, alcohol, or nitrous oxide.

In an embodiment, an ALD cycle for forming LnYAlO may include sequencing the metal-containing precursors in the order of lanthanide, yttrium, and aluminum. Alternatively, an ALD cycle for forming LnYAlO may include sequencing the metal-containing precursors in the order of yttrium, lanthanide, and aluminum. Another sequencing may include the order: aluminum, yttrium, and lanthanide or the order: aluminum, lanthanide, and yttrium. Oxygen reactant precursors may be applied after pulsing each metal-containing precursor or after pulsing all the metal-containing precursors. Embodiments for methods for forming lanthanide yttrium aluminum oxide film by atomic layer deposition may include numerous permutations of lanthanum sequences, yttrium sequences, and aluminum sequences for forming the lanthanide yttrium aluminum oxide film. In an embodiment, a lanthanum/yttrium/aluminum cycle may include a number, x, of lanthanum sequences, a number, y, of yttrium sequences, and a number, z, of aluminum sequences, in which reactant precursors associated with each metal are applied with the associated sequence. Alternatively, each sequence may be applied without a reactant precursor within each given sequence, with the pulsing of an oxygen reactant precursor permuted with the sequencing of the metal-containing precursors to form a lanthanum/yttrium/aluminum/oxygen cycle. The number of sequences x, y, and z may be selected to engineer the relative amounts of lanthanide to yttrium. In an embodiment, the number of sequences x and y, along with associated pulsing periods and times, is selected to form a lanthanide yttrium aluminum oxide with substantially equal amounts of lanthanum and yttrium. In an embodiment, the number of sequences is selected with x=y. In an embodiment, the number of sequences x and y are selected to form a lanthanum-rich lanthanide yttrium aluminum oxide. Alternatively, the number of sequences x and y are selected to form a yttrium-rich lanthanide yttrium aluminum oxide. In an embodiment, the number of sequences x, y, and z may be selected to engineer the relative amounts of aluminum to oxygen. In an embodiment, the number of sequences x, y, and z may be selected to engineer a dielectric layer to form a $Ln_xY_{1-x}AlO_3$ film with $0<x<1$. In an embodiment, the number of sequences x, y, and z may be selected to engineer a dielectric layer to form a $Ln_xY_{1-x}AlO_3$ film with $0<x<1$, where x is selected to provide a maximum dielectric constant for a LnYAlO film. In an embodiment, the number of sequences and the order of performing the sequences may be selected in an ALD cycle for LnYAlO to provide a $Ln_xY_{1-x}AlO_3$ film, where $0.2<x<0.4$. In an embodiment, a LnYAlO film may be engineered to have a dielectric constant, the value of which lies in the range from the dielectric constant for $LnAlO_3$ to the dielectric constant for $YAlO_3$. In an embodiment, a LnYAlO film may be engineered to provide a lanthanide yttrium aluminum oxide film having a dielectric constant between 21 and 32. In an embodiment, a LnYAlO film may be engineered to have a dielectric constant greater than 25.

In various embodiments, nitrogen may be used as a purging gas and a carrier gas for one or more of the sequences used in the ALD formation of a LnYAlO film. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

After repeating a selected number of ALD cycles, a determination may be made as to whether the number of lanthanum/yttrium/aluminum cycles equals a predetermined number to form the desired lanthanide yttrium aluminum oxide layer. If the total number of cycles to form the desired thickness has not been completed, a number of cycles for the lanthanum, yttrium, and aluminum sequences is repeated. If the total number of cycles to form the desired thickness has been completed, the dielectric film containing the lanthanide yttrium aluminum oxide layer may optionally be annealed. The lanthanide yttrium aluminum oxide layer processed at these relatively low temperatures may provide an amorphous layer.

The thickness of a lanthanide yttrium aluminum oxide layer formed by atomic layer deposition may be determined by a fixed growth rate for the pulsing periods and precursors used, set at a value such as N nm/cycle, dependent upon the number of cycles of the lanthanum/yttrium/aluminum sequences. Depending on the precursors used for ALD formation of a LnYAlO film, the process may be conducted in an ALD window, which is a range of temperatures in which the growth rate is substantially constant. If such an ALD window is not available, the ALD process may be conducted at the same set of temperatures for each ALD cycle in the process. For a desired lanthanide yttrium aluminum oxide layer thickness, t, in an application, the ALD process is repeated for t/N total cycles. Once the t/N cycles have completed, no further ALD processing for the lanthanide yttrium aluminum oxide layer is required.

Atomic layer deposition of the individual components of the lanthanide yttrium aluminum oxide film allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a LnYAlO film, each precursor may be pulsed into the reaction chamber under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

Films of LnYAlO may be processed over a wide range of temperatures. Low temperature processing may lead to an amorphous structure and have fewer adverse effects on the substrate and any devices formed prior to the ALD formation of the lanthanide yttrium aluminum oxide film. In an embodiment, a film of LnYAlO is formed on a substrate with the substrate maintained at a temperature in the range from about 100° C. to about 600° C. The lanthanide yttrium aluminum oxide film may be formed as an integral component of an electronic device in an integrated circuit.

Either before or after forming the LnYAlO film, other dielectric layers such as nitride layers, dielectric metal silicates, insulating metal oxides including $AlO_x$, $YO_x$, $LaO_x$, and other lanthanide oxides such as $PrO_x$, $NdO_x$, $SmO_x$, $GdO_x$, $DyO_x$, $CeO_x$, $TbO_x$, $ErO_x$, $EuO_x$, $LuO_x$, $TmO_x$, $HoO_x$, $PmO_x$, and $YbO_x$ or combinations thereof may be formed as part of a dielectric layer or dielectric stack. These one or more other layers of dielectric material may be provided in stoichiometric form, in non-stoichiometric form, or a combination of stoichiometric dielectric material and non-stoichiometric dielectric material. Depending on the application, a dielectric stack containing a LnYAlO film may include a silicon oxide layer. In an embodiment, the dielectric layer may be formed as a nanolaminate. An embodiment of a nanolaminate may include a layer of a lanthanide oxide and a LnYAlO film, a layer of yttrium oxide and a LnYAlO film, a layer of aluminum oxide and a LnYAlO film, layers of lanthanide oxide, yttrium oxide, and aluminum oxide along with a LnYAlO film, or various other combinations. Alternatively, a dielectric layer may be formed substantially as the lanthanide yttrium aluminum oxide film.

In various embodiments, the structure of an interface between a dielectric layer and a substrate on which it is disposed is controlled to limit the inclusion of silicon oxide, since a silicon oxide layer would reduce the effective dielectric constant of the dielectric layer. The material composition and properties for an interface layer may be dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In the various embodiments, the thickness of a lanthanide yttrium aluminum oxide film is related to the number of ALD cycles performed and the growth rate associated with the selected permutations of sequences in the cycles. As can be understood by those skilled in the art, particular effective growth rates for the engineered lanthanide yttrium aluminum oxide film can be determined during normal initial testing of the ALD system for processing a lanthanide yttrium aluminum oxide dielectric for a given application without undue experimentation.

In an embodiment, the lanthanide yttrium aluminum oxide layer may be doped with lanthanides such as La, Pr, N, Sm, Gd, Dy, Ce, Tb, Er, Eu, Lu, Tm, Ho, Pm, and Yb other than the lanthanide of the LnYAlO film. The doping may be employed to enhance the leakage current characteristics of the dielectric layer containing the LnYAlO film by providing a disruption or perturbation of the lanthanide yttrium aluminum oxide structure. Such doping may be realized by substituting a sequence of one of these lanthanides for a lanthanum sequence, a yttrium sequence, an aluminum sequence, or various combinations of sequences. The choice for substitution may depend on the form of the lanthanide yttrium aluminum oxide structure with respect to the ratio of lanthanide atoms to yttrium atoms desired in the oxide. To maintain a substantially lanthanide yttrium aluminum oxide, the amount of alternate lanthanides or other dopants doped into the oxide may be limited to a relatively small fraction of the total number of lanthanide and yttrium atoms. Such a fraction may be 10 percent or less.

In an embodiment, a dielectric layer containing a lanthanide yttrium aluminum oxide layer may have a $t_{eq}$ ranging from about 5 Å to about 20 Å. In an embodiment, a dielectric layer containing a lanthanide yttrium aluminum oxide layer may have a $t_{eq}$ of less than 5 Å. In an embodiment, a lanthanide yttrium aluminum oxide film may be formed with a thickness ranging from a monolayer to thousands of angstroms. Further, dielectric films of lanthanide yttrium aluminum oxide formed by atomic layer deposition may provide not only thin $t_{eq}$ films, but also films with relatively low leakage current. Additionally, embodiments may be implemented to form transistors, capacitors, memory devices, and other electronic systems including information handling devices.

Figure 2:
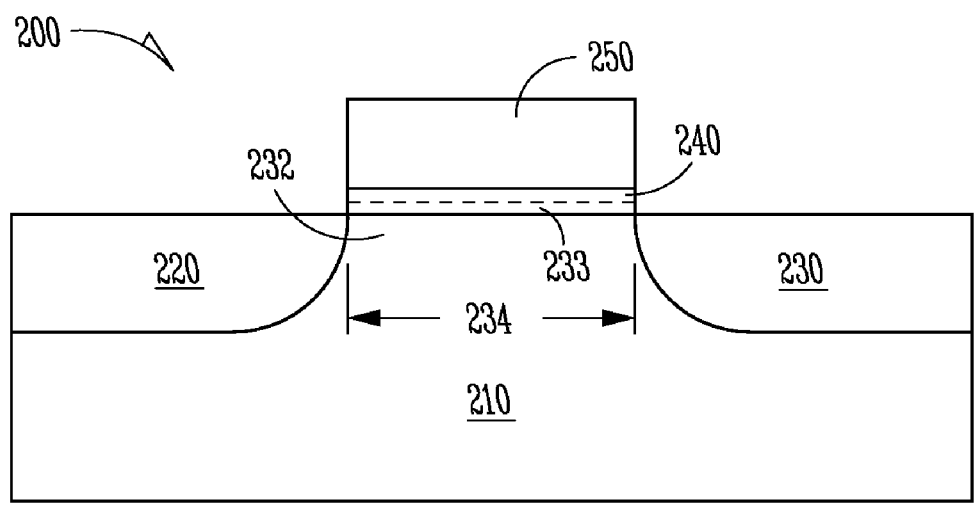
FIG. 2 shows an embodiment of a transistor having a dielectric layer containing a lanthanide yttrium aluminum oxide film.

FIG. 2 shows an embodiment of a transistor 200 having a dielectric layer 240 containing a lanthanide yttrium aluminum oxide film. Transistor 200 may include a source region 220 and a drain region 230 in a silicon-based substrate 210 where source and drain regions 220, 230 are separated by a body region 232. Body region 232 defines a channel having a channel length 234. A gate dielectric 240 may be disposed on substrate 210 with gate dielectric 240 formed as a dielectric layer containing lanthanide yttrium aluminum oxide. Gate dielectric 240 may be realized as a dielectric layer formed substantially of lanthanide yttrium aluminum oxide. Gate dielectric 240 may be constructed as multiple dielectric layers, that is, as a dielectric stack, containing at least one lanthanide yttrium aluminum oxide film and one or more layers of insulating material other than a lanthanide yttrium aluminum oxide film. The lanthanide yttrium aluminum oxide may be structured as one or more monolayers. An embodiment of a lanthanide yttrium aluminum oxide film may be formed by atomic layer deposition. A gate 250 may be formed over and contact gate dielectric 240.

An interfacial layer 233 may form between body region 232 and gate dielectric 240. In an embodiment, interfacial layer 233 may be limited to a relatively small thickness compared to gate dielectric 240, or to a thickness significantly less than gate dielectric 240 as to be effectively eliminated. Forming the substrate and the source and drain regions may be performed using standard processes known to those skilled in the art. Additionally, the sequencing of the various elements of the process for forming a transistor may be conducted with fabrication processes known to those skilled in the art. In an embodiment, gate dielectric 240 may be realized as a gate insulator in a silicon CMOS. Use of a gate dielectric containing lanthanide yttrium aluminum oxide is not limited to silicon based substrates, but may be used with a variety of semiconductor substrates.

Figure 3:
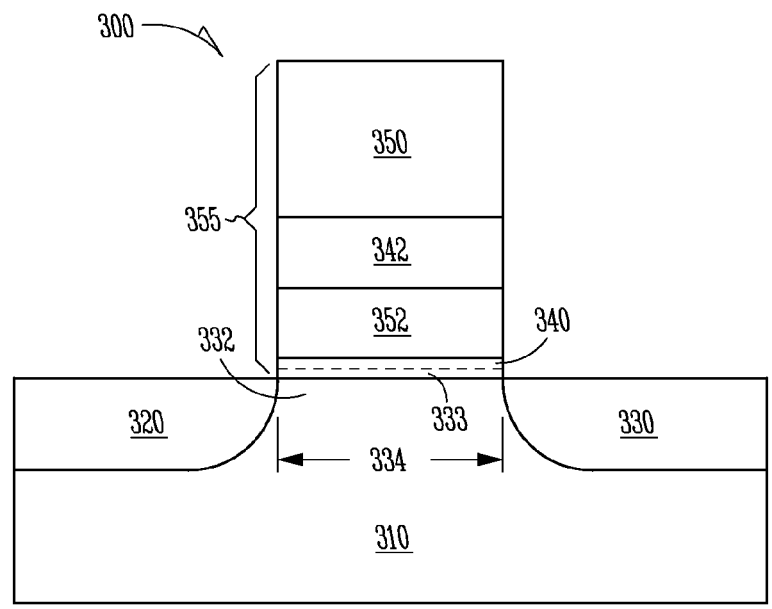
FIG. 3 shows an embodiment of a floating gate transistor having a dielectric layer containing a lanthanide yttrium aluminum oxide film.

FIG. 3 shows an embodiment of a floating gate transistor 300 having a dielectric layer containing a lanthanide yttrium aluminum oxide film. The lanthanide yttrium aluminum oxide film may be structured as one or more monolayers. The lanthanide yttrium aluminum oxide film may be formed using atomic layer deposition techniques. Transistor 300 may include a silicon-based substrate 310 with a source 320 and a drain 330 separated by a body region 332. Body region 332 between source 320 and drain 330 defines a channel region having a channel length 334. Located above body region 332 is a stack 355 including a gate dielectric 340, a floating gate 352, a floating gate dielectric 342, and a control gate 350. An interfacial layer 333 may form between body region 332 and gate dielectric 340. In an embodiment, interfacial layer 333 may be limited to a relatively small thickness compared to gate dielectric 340, or to a thickness significantly less than gate dielectric 340 as to be effectively eliminated.

In an embodiment, gate dielectric 340 includes a dielectric containing an atomic layer deposited lanthanide yttrium aluminum oxide film formed in embodiments similar to those described herein. Gate dielectric 340 may be realized as a dielectric layer formed substantially of lanthanide yttrium aluminum oxide. Gate dielectric 340 may be a dielectric stack containing at least one lanthanide yttrium aluminum oxide film and one or more layers of insulating material other than a lanthanide yttrium aluminum oxide film. In an embodiment, floating gate 352 may be formed over and contact gate dielectric 340.

In an embodiment, floating gate dielectric 342 includes a dielectric containing a lanthanide yttrium aluminum oxide film. The LnYAlO film may be structured as one or more monolayers. In an embodiment, the LnYAlO may be formed using atomic layer deposition techniques. Floating gate dielectric 342 may be realized as a dielectric layer formed substantially of lanthanide yttrium aluminum oxide. Floating gate dielectric 342 may be a dielectric stack containing at least one lanthanide yttrium aluminum oxide film and one or more layers of insulating material other than a lanthanide yttrium aluminum oxide film. In an embodiment, control gate 350 may be formed over and contact floating gate dielectric 342.

Alternatively, both gate dielectric 340 and floating gate dielectric 342 may be formed as dielectric layers containing a lanthanide yttrium aluminum oxide film structured as one or more monolayers. Gate dielectric 340 and floating gate dielectric 342 may be realized by embodiments similar to those described herein, with the remaining elements of the transistor 300 formed using processes known to those skilled in the art. In an embodiment, gate dielectric 340 forms a tunnel gate insulator and floating gate dielectric 342 forms an inter-gate insulator in flash memory devices, where gate dielectric 340 and floating gate dielectric 342 may include a lanthanide yttrium aluminum oxide film structured as one or more monolayers. Such structures are not limited to silicon based substrates, but may be used with a variety of semiconductor substrates.

Figure 4:
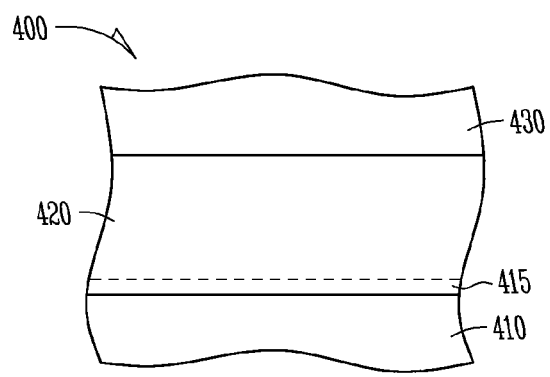
FIG. 4 shows an embodiment of a capacitor having a dielectric layer containing a lanthanide yttrium aluminum oxide film.

Embodiments of a lanthanide yttrium aluminum oxide film structured as one or more monolayers may also be applied to capacitors in various integrated circuits, memory devices, and electronic systems. In an embodiment for a capacitor 400 illustrated in FIG. 4, a method includes forming a first conductive layer 410, forming a dielectric layer 420 containing a lanthanide yttrium aluminum oxide film structured as one or more monolayers on first conductive layer 410, and forming a second conductive layer 430 on dielectric layer 420. Dielectric layer 420, containing a lanthanide yttrium aluminum oxide film, may be formed using various embodiments described herein. Dielectric layer 420 may be realized as a dielectric layer formed substantially of lanthanide yttrium aluminum oxide. Dielectric layer 420 may be a dielectric stack containing at least one lanthanide yttrium aluminum oxide film and one or more layers of insulating material other than a lanthanide yttrium aluminum oxide film. An interfacial layer 415 may form between first conductive layer 410 and dielectric layer 420. In an embodiment, interfacial layer 415 may be limited to a relatively small thickness compared to dielectric layer 420, or to a thickness significantly less than dielectric layer 420 as to be effectively eliminated.

Embodiments for a lanthanide yttrium aluminum oxide film structured as one or more monolayers may include, but are not limited to, a capacitor in a DRAM and capacitors in analog, radio frequency (RF), and mixed signal integrated circuits. Mixed signal integrated circuits are integrated circuits that may operate with digital and analog signals.

Figure 5:
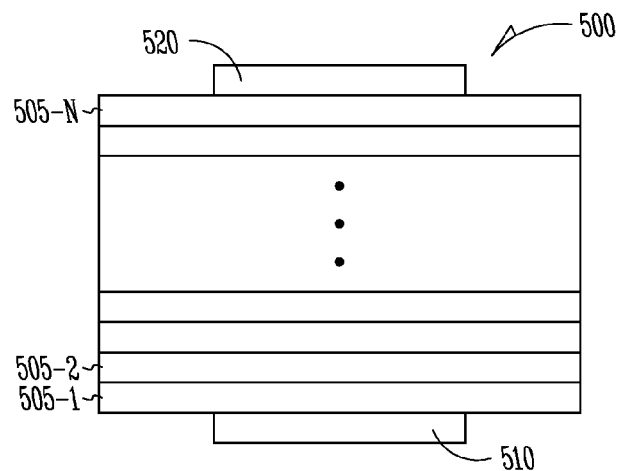
FIG. 5 depicts an embodiment of a dielectric layer having multiple layers including a lanthanide yttrium aluminum oxide layer.

FIG. 5 depicts an embodiment of a dielectric structure 500 having multiple dielectric layers 505-1, 505-2, . . . 505-N, in which at least one layer is a lanthanide yttrium aluminum oxide layer. Layers 510 and 520 may provide means to contact dielectric layers 505-1, 505-2, . . . 505-N. Layers 510 and 520 may be electrodes forming a capacitor. Layer 510 may be a body region of a transistor with layer 520 being a gate. Layer 510 may be a floating gate electrode with layer 520 being a control gate.

In an embodiment, dielectric structure 500 includes one or more layers 505-1, 505-2, ... 505-N as dielectric layers other than a LnYAlO layer, where at least one layer is a LnYAlO layer. Dielectric layers 505-1, 505-2, ... 505-N may include a $LnO_x$ layer. Dielectric layers 505-1, 505-2, ... 505-N may include an $LnAlO_x$ layer. Dielectric layers 505-1, 505-2, ... 505-N may include an $YO_x$ layer. Dielectric layers 505-1, 505-2, ... 505-N may include an $YAlO_x$ layer. Dielectric layers 505-1, 505-2, ... 505-N may include an $AlO_x$ layer. Dielectric layers 505-1, 505-2, ... 505-N may include an insulating metal oxide layer, whose metal is selected to be a metal different from the lanthanide, yttrium and aluminum. Dielectric layers 505-1, 505-2, ... 505-N may include an insulating nitride layer. Dielectric layers 505-1, 505-2, ... 505-N may include an insulating oxynitride layer. Dielectric layers 505-1, 505-2, ... 505-N may include a silicon nitride layer. Dielectric layers 505-1, 505-2, ... 505-N may include an insulating silicate layer. Dielectric layers 505-1, 505-2, ... 505-N may include a silicon oxide layer.

Various embodiments for a dielectric layer containing a lanthanide yttrium aluminum oxide film structured as one or more monolayers may provide for enhanced device performance by providing devices with reduced leakage current. Such improvements in leakage current characteristics may be attained by forming one or more layers of a lanthanide yttrium aluminum oxide in a nanolaminate structure with other metal oxides, non-metal-containing dielectrics, or combinations thereof. The transition from one layer of the nanolaminate to another layer of the nanolaminate provides disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, a $LaO_x$/LnYAlO nanolaminate contains alternating layers of a lanthanum oxide and LnYAlO. Alternatively, a lanthanide oxide may be used in place of the $LaO_x$ layer, where the lanthanide of the lanthanide oxide may be the same element as that in the LnYAlO layer or a different element. In an embodiment, an $YO_y$/LnYAlO nanolaminate contains alternating layers of yttrium oxide and LnYAlO. In an embodiment, an $AlO_z$/LnYAlO nanolaminate contains alternating layers of aluminum oxide and LnYAlO. In an embodiment, a $LaO_x$/$YO_y$/$AlO_z$/LnYAlO nanolaminate contains various permutations of lanthanum oxide layers, yttrium oxide layers, aluminum oxide layers, and lanthanide yttrium aluminum oxide layers.

In an embodiment, dielectric structure 500 may be structured as a nanolaminate structure 500 including a lanthanide yttrium aluminum oxide film structured as one or more monolayers. Nanolaminate structure 500 includes a plurality of layers 505-1, 505-2 to 505-N, where at least one layer contains a lanthanide yttrium aluminum oxide film structured as one or more monolayers. The other layers may be insulating nitrides, insulating oxynitrides, and other dielectric materials such as insulating metal oxides. The sequencing of the layers depends on the application. The effective dielectric constant associated with nanolaminate structure 500 is that attributable to N capacitors in series, where each capacitor has a thickness defined by the thickness and composition of the corresponding layer. By selecting each thickness and the composition of each layer, a nanolaminate structure can be engineered to have a predetermined dielectric constant. Embodiments for structures such as nanolaminate structure 500 may be used as nanolaminate dielectrics in non-volatile read only memory (NROM) flash memory devices as well as other integrated circuits. In an embodiment, a layer of the nanolaminate structure 500 is used to store charge in a NROM device. The charge storage layer of a nanolaminate structure 500 in a NROM device may be a silicon oxide layer.

Transistors, capacitors, and other devices may include dielectric films containing a layer of a lanthanide yttrium aluminum oxide compound structured as one or more monolayers. The lanthanide yttrium aluminum oxide layer may be formed by atomic layer deposition. Dielectric films containing a lanthanide yttrium aluminum oxide layer may be implemented into memory devices and electronic systems including information handling devices. Further, embodiments of electronic devices may be realized as integrated circuits. Embodiments of information handling devices may include wireless systems, telecommunication systems, and computers.

Figure 6:
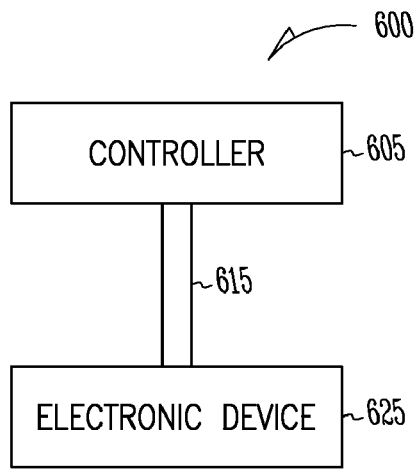
FIG. 6 is a simplified diagram for an embodiment of a controller coupled to an electronic device having a dielectric layer containing a lanthanide yttrium aluminum oxide film.

FIG. 6 illustrates a block diagram for an electronic system 600 having one or more devices having a dielectric structure including a lanthanide yttrium aluminum oxide film structured as one or more monolayers. Electronic system 600 includes a controller 605, a bus 615, and an electronic device 625, where bus 615 provides electrical conductivity between controller 605 and electronic device 625. In various embodiments, controller 605 may include an embodiment of a lanthanide yttrium aluminum oxide film. In various embodiments, electronic device 625 may include an embodiment of a lanthanide yttrium aluminum oxide film. In various embodiments, controller 605 and electronic device 625 may include embodiments of a lanthanide yttrium aluminum oxide film. Electronic system 600 may include, but is not limited to, fiber optic systems, electro-optic systems, and information handling systems such as wireless systems, telecommunication systems, and computers.

Figure 7:
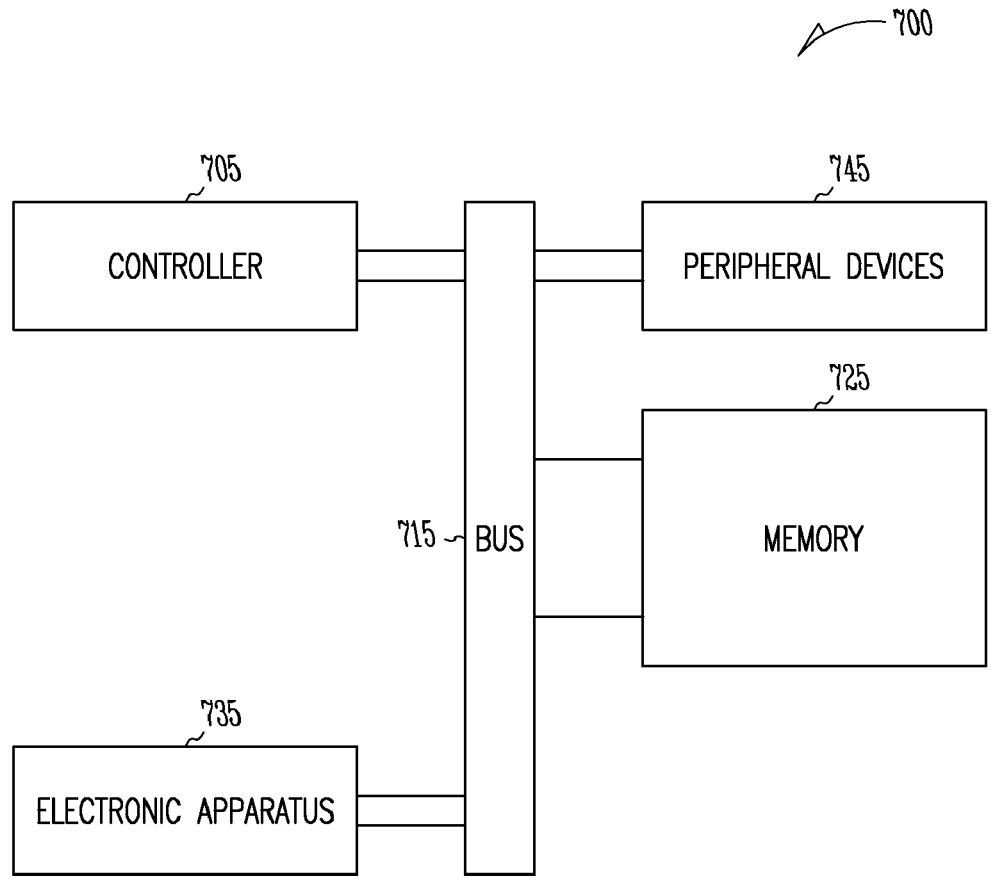
FIG. 7 illustrates a diagram for an embodiment of an electronic system having devices with a dielectric film containing a lanthanide yttrium aluminum oxide film.

FIG. 7 depicts a diagram of an embodiment of a system 700 having a controller 705 and a memory 725. Controller 705 may include a lanthanide yttrium aluminum oxide film structured as one or more monolayers. Memory 725 may include a lanthanide yttrium aluminum oxide film structured as one or more monolayers. Controller 705 and memory 725 may each include a lanthanide yttrium aluminum oxide film structured as one or more monolayers. System 700 also includes an electronic apparatus 735 and a bus 715, where bus 715 provides electrical conductivity between controller 705 and electronic apparatus 735, and between controller 705 and memory 725. Bus 715 may include an address bus, a data bus, and a control bus, each independently configured. Alternatively, bus 715 may use common conductive lines for providing one or more of address, data, or control, the use of which is regulated by controller 705. In an embodiment, electronic apparatus 735 may be additional memory configured in a manner similar to memory 725. An embodiment may include an additional peripheral device or devices 745 coupled to bus 715. In an embodiment, controller 705 is a processor. One or more of controller 705, memory 725, bus 715, electronic apparatus 735, or peripheral devices 745 may include an embodiment of a dielectric layer having a lanthanide yttrium aluminum oxide film structured as one or more monolayers System 700 may include, but is not limited to, information handling devices, telecommunication systems, and computers.

Peripheral devices 745 may include displays, additional storage memory, or other control devices that may operate in conjunction with controller 705. Alternatively, peripheral devices 745 may include displays, additional storage memory, or other control devices that may operate in conjunction with memory 725, or controller 705 and memory 725.

Memory 725 may be realized as a memory device containing a lanthanide yttrium aluminum oxide film structured as one or more monolayers. The lanthanide yttrium aluminum oxide structure may be formed in a memory cell of a memory array. The lanthanide yttrium aluminum oxide structure may be formed in a capacitor in a memory cell of a memory array. The lanthanide yttrium aluminum oxide structure may be formed in a transistor in a memory cell of a memory array. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:
   forming an electronic apparatus;
   forming lanthanide yttrium aluminum oxide as a portion of the electronic apparatus; and
   forming the lanthanide yttrium aluminum oxide by a monolayer or partial monolayer sequencing process.

2. The method of claim 1, wherein forming the lanthanide yttrium aluminum oxide using the monolayer or partial monolayer sequencing process includes forming the lanthanide yttrium aluminum oxide using a self-limiting monolayer or partial monolayer sequencing process.

3. The method of claim 1, wherein forming the lanthanide yttrium aluminum oxide includes forming a yttrium-rich lanthanide yttrium aluminum oxide film or a lanthanide-rich lanthanide yttrium aluminum oxide film.

4. The method of claim 1, wherein using the monolayer or partial monolayer sequencing process includes forming lanthanum yttrium aluminum oxide using a $C_{18}H_{54}N_3LaSi_6$ precursor.

5. The method of claim 1, wherein using the monolayer or partial monolayer sequencing process includes using one or more of a $V(thd)_3$ precursor, a $Y(thd)_3(2,2'\text{-bipyridyl})$ precursor, or a $Y(thd)_3(1,10\text{-phenanthroline})$ precursor.

6. The method of claim 1, wherein forming the lanthanide yttrium aluminum oxide includes forming $La_xY_{1-x}AlO_3$, where $0.2<x<0.4$.

7. The method of claim 1. wherein forming the electronic apparatus includes forming a transistor having a dielectric arranged with a gate of the transistor such that the arrangement operatively affects current flow in the transistor, the dielectric containing the lanthanide yttrium aluminum oxide.

8. The method of claim 1, wherein forming the electronic apparatus includes forming a capacitor having a capacitor dielectric containing the lanthanide yttrium aluminum oxide.

9. The method of claim 1, wherein the method includes forming a conductive path to a conductive structure on and contacting a dielectric containing the lanthanide yttrium aluminum oxide such that in operation the conductive path is arranged to provide a signal to the conductive structure to operate the electronic apparatus in an electronic system.

10. The method of claim 1, wherein forming the electronic apparatus includes forming the electronic apparatus as an integrated circuit.

11. A method comprising:
    forming an electronic apparatus;
    forming a dielectric stack in the electronic apparatus, the dielectric stack having a plurality of dielectric materials including lanthanide yttrium aluminum oxide; and
    forming the lanthanide yttrium aluminum oxide in the dielectric stack by a monolayer or partial monolayer sequencing process.

12. The method of claim 11, wherein forming the dielectric stack includes forming one or more of $LaO_x$, $PrO_x$, $NdO_x$, $SmO_x$, $GdO_x$, $DyO_x$, $CeO_x$, $TbO_x$, $ErO_x$, $EuO_x$, $LuO_x$, $TmO_x$, $HoO_x$, $PmO_x$, and $YbO_x$, separate from forming the lanthanide yttrium aluminum oxide.

13. The method of claim 11, wherein forming the dielectric stack includes forming one or more of an insulating nitride, an insulating oxynitride, a dielectric metal silicate, or an insulating metal oxide, the insulating metal oxide being different from a lanthanide oxide.

14. The method of claim 11, wherein forming the dielectric stack includes forming a nanolaminate containing the lanthanide yttrium aluminum oxide.

15. The method of claim 14, wherein forming the nanolaminate includes forming silicon oxide in the nanolaminate in a non-volatile read only memory (NROM) flash memory, the silicon oxide structured to operatively store charge.

16. The method of claim 14, wherein firming the nanolaminate containing the lanthanide yttrium aluminum oxide includes forming a $LaO_x/YO_y/AlO_z/$ LnYAlO dielectric nanolaminate.

17. A method comprising:
    forming an electronic apparatus;
    forming lanthanide yttrium aluminum oxide as a portion of the electronic apparatus;
    forming the lanthanide yttrium aluminum oxide using a monolayer or partial monolayer sequencing process; and
    doping the lanthanide yttrium aluminum oxide.

18. The method of claim 17, wherein doping the lanthanide yttrium aluminum oxide includes doping the lanthanide yttrium aluminum oxide with one or more lanthanides, the one or more lanthanides being different from the lanthanide in the lanthanide yttrium aluminum oxide.

19. The method of claim 17, wherein doping the lanthanide yttrium aluminum oxide includes substituting a dopant precursor for a precursor containing lanthanide, yttrium, or aluminum in a number of cycles of the monolayer or partial monolayer sequencing process forming the lanthanide yttrium aluminum oxide.

20. The method of claim 17, wherein doping the lanthanide yttrium aluminum oxide includes doping the lanthanide yttrium aluminum oxide with an element or a compound other than lanthanide, yttrium, aluminum, and oxygen.

* * * * *

UNITED STATES PATENT AND TRADEMARK OFFICE
CERTIFICATE OF CORRECTION

PATENT NO. : 8,399,320 B2  
APPLICATION NO. : 13/345984  
DATED : March 19, 2013  
INVENTOR(S) : Kie Y. Ahn et al.

Page 1 of 1

It is certified that error appears in the above-identified patent and that said Letters Patent is hereby corrected as shown below:

In the Specifications:

In column 1, line 7, delete "2009now" and insert -- 2009 now --, therefor.

In the Claims:

In column 17, line 56, in Claim 5, delete "V(thd)$_3$" and insert -- Y(thd)$_3$ --, therefor.

In column 17, line 60, in Claim 6, delete "La$_x$Y$_{1-x}$AlO$_3$," and insert -- La$_x$Y$_{1-x}$AlO$_3$, --, therefor.

In column 17, line 62, in Claim 7, delete "claim 1." and insert -- claim 1, --, therefor.

In column 18, line 38, in Claim 16, delete "firming" and insert -- forming --, therefor.

In column 18, line 40, in Claim 16, delete "/ LnYAlO" and insert -- /LnYAlO --, therefor.

Signed and Sealed this  
Twenty-eighth Day of May, 2013

Teresa Stanek Rea  
*Acting Director of the United States Patent and Trademark Office*